United States Patent
Webster et al.

(10) Patent No.: US 7,592,197 B2
(45) Date of Patent: Sep. 22, 2009

(54) IMAGE SENSOR CHIP PACKAGE FABRICATION METHOD

(75) Inventors: Steven Webster, Miao-li (TW); Ying-Cheng Wu, Miao-li (TW); Kun-Hsieh Liu, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 521 days.

(21) Appl. No.: 11/453,456

(22) Filed: Jun. 14, 2006

(65) Prior Publication Data
US 2007/0057149 A1    Mar. 15, 2007

(30) Foreign Application Priority Data
Sep. 9, 2005    (CN) .................. 2005 1 0037204

(51) Int. Cl.
  *H01L 21/00*    (2006.01)
(52) U.S. Cl. .................. 438/67; 257/E31.117
(58) Field of Classification Search .......... 438/67; 257/E31.117
See application file for complete search history.

(56) References Cited

U.S. PATENT DOCUMENTS

| | | | |
|---|---|---|---|
| 6,531,333 B2 * | 3/2003 | Lin et al. | 438/64 |
| 6,686,588 B1 * | 2/2004 | Webster et al. | 250/239 |
| 7,214,116 B2 * | 5/2007 | Takekuma | 445/24 |
| 7,436,002 B2 * | 10/2008 | Brunner et al. | 257/99 |

FOREIGN PATENT DOCUMENTS

| | | |
|---|---|---|
| CN | 2543207 Y | 4/2003 |
| CN | 2653694 Y | 11/2004 |

* cited by examiner

*Primary Examiner*—David S Blum
(74) *Attorney, Agent, or Firm*—Zhigang Ma (57) ABSTRACT

An image sensor package method includes the steps of: first, providing a carrier (30), which includes a base (24) and a leadframe (320). The base has a cavity therein and the leadframe includes a number of conductive pieces; Second, mounting an image sensor chip on the base and received in the cavity, the image sensor having a photosensitive area. Third, providing a plurality of wires, each electrically connects the image sensor chip and a corresponding one of the conductive pieces of the carrier. Fourth, applying an adhesive means around the image sensor chip that at least partially covers all the wires. Finally, mounting a transparent cover on the carrier, where an adhesive means fixes the cover in place.

14 Claims, 6 Drawing Sheets

IMAGE SENSOR CHIP PACKAGE FABRICATION METHOD

CROSS-REFERENCE TO RELATED APPLICATIONS

This application is related to a co-pending U.S. patent application Ser. No. 11/453,454, entitled "DIGITAL CAMERA MODULE PACKAGE FABRICATION METHOD", by Steven Webster et al. Such application has the same assignee as the present application and has been concurrently filed herewith. The disclosure of the above identified application is incorporated herein by reference.

TECHNICAL FIELD

The present invention generally relates to an integrated circuit (IC) chip package fabrication method and, more particularly, to an image sensor chip package for use in digital cameras.

BACKGROUND

Image sensors are widely used in digital camera modules in order to convert the optical image data of an object into electrical signals. In order to protect the image sensor from contamination or pollution (i.e. from dust or water vapor), the image sensor is generally sealed in a structural package.

Figure 9:
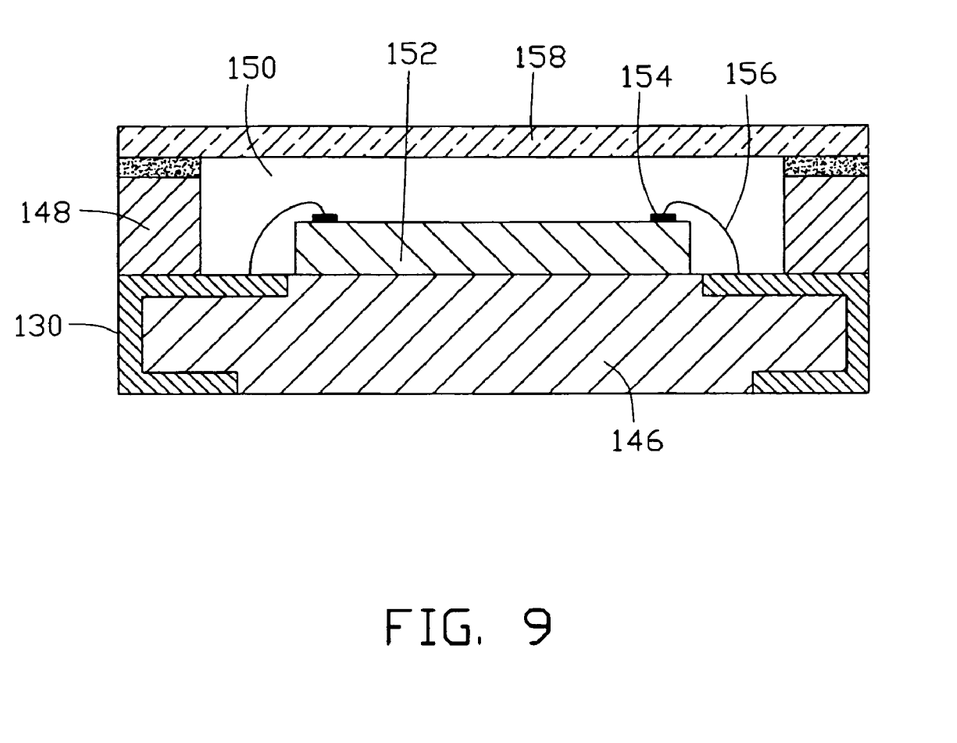
FIG. 9 is a schematic, cross-sectional view of a typical image sensor chip package.

A typical image sensor chip package method (not labeled) was disclosed in Chinese Publication Number CN1518079 on Aug. 4, 2004, and is illustrated in FIG. 9. The image sensor chip package method includes the following steps: firstly, a plurality of [ -shaped conductors 130 are provided. Secondly, plastics are injected to partially enclose the conductors 130, thereby forming a base 146. Some of the conductors 130 are exposed outside of the base 146. Thirdly, a ring-like middle portion 148 is further formed on the base 146 by means of injection. The base 146 and the middle portion 148 cooperatively form a space 150. Fourthly, an image sensor 152 having a plurality of pads 154 is disposed in the space 150. Fifthly, a number of bonding wires 156 are provided to connect the pads 154 and the conductors 130. Finally, a cover 158 is secured to the top of the middle portion 148 via an adhesive glue, thereby hermetically sealing the space 150 and allowing light beams to pass therethrough.

In the process of connecting the wires 156, each wire 156 needs to be connected with the conductor 130. As a result, a larger space is needed in order for the chip package to operate properly. This method of connecting wires 156 is complex and as a result it is also expensive. In addition, the relative large volume of the image sensor chip package results in more dust-particles adhering to the cover 158, the bottom board and the sidewalls of the base 146. Thus, more dust-particles will drop onto the chip 152. The dust-particles obscure the optical path and produce errors in the image sensing process. Accordingly, the quality and/or reliability of the image sensor chip package 100 can be affected. Moreover, the bonding wires 156, exposed in the space 150, lack protection and may thus easily be damaged by dust-particles entering the space 150.

Therefore, a new image sensor chip package fabrication method is desired in order to overcome the above-described shortcomings.

SUMMARY OF THE INVENTION

One embodiment of an image sensor chip package method includes the steps of:

providing a carrier comprising a base and a leadframe, the base having a cavity therein, the leadframe comprising a plurality of conductive pieces, the conductive pieces of the leadframe being embedded in the base and spaced from each other;

mounting an image sensor chip in the cavity, the image sensor having a photosensitive area;

providing a plurality of wires, each electrically connecting the image sensor chip with a corresponding one of the conductive pieces of the carrier;

applying an adhesive means around the image sensor chip and at least partially covering all the wires; and mounting a transparent cover to the carrier, the adhesive means adhering to the cover and configured in a manner so as to define a sealing space for a photosensitive area of the image sensor chip therein, and the base and the cover allowing one end of the conductive pieces to be exposed out therefrom.

Other advantages and novel features will become more apparent from the following detailed description when taken in conjunction with the accompanying drawings.

BRIEF DESCRIPTION OF THE DRAWINGS

Many aspects of the present image sensor chip package can be better understood with reference to the following drawings. The components in the drawings are not necessarily drawn to scale, the emphasis instead being placed upon clearly illustrating the principles of the image sensor chip package. Moreover, in the drawings, like reference numerals designate corresponding parts throughout the several views.

DETAILED DESCRIPTION OF THE PREFERRED EMBODIMENTS

Figure 1:
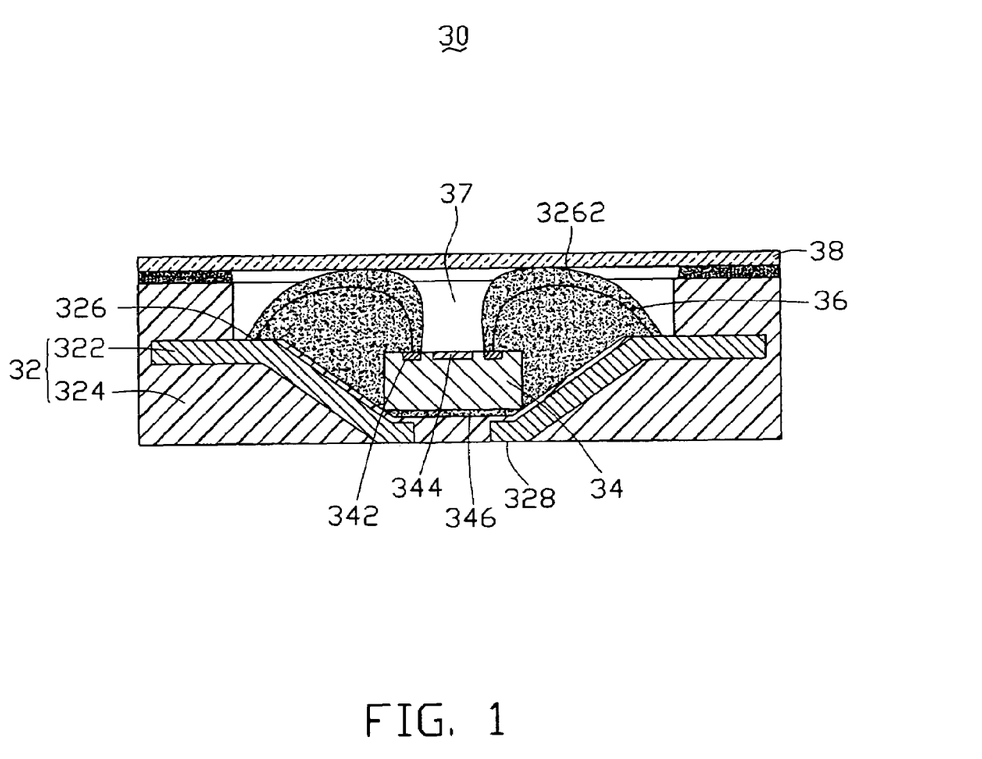
FIG. 1 is a schematic, cross-sectional view of an image sensor chip package according to a preferred embodiment.

Referring to FIG. 1, an image sensor chip package 30 in accordance with a preferred embodiment is shown. The image sensor chip package 30 includes a carrier 32, a chip 34, a number of bonding wires 36 and a cover 38.

The carrier 32 of the image sensor chip package 30 includes a number of conductive pieces 322 and a plastic base 324. The conductive pieces 322 are spaced from each other and aligned in parallel, and cooperatively form the carrier 32 when combined with the plastic base 324.

The image sensor chip 34 is received in the carrier 32, and is adhered to the bottom of the carrier 32 with an adhesive glue 346. A top surface of the image sensor chip 34 is arranged with a photosensitive area 344 and a number of chip pads 342 around the photosensitive area 344.

The bonding wires 36 can be made of a conductive material such as, for example, gold or aluminum alloy. One end of each wire 36 is connected/joined with a respective chip pad 342 of the image sensor chip 34, and the other end of the wire 36 is connected/joined with a respective upper pad 326 formed by the conductive pieces 322.

The cover 38 is transparent and is laid over the image sensor chip 34 which receives light transmitted through the cover 38. The cover 38 is adhered to the base 324 by glue (not labeled) and therefore seals the image sensor chip 34 in the cavity of the base 324.

An adhesive glue 3262, such as a silicone, epoxy, acrylic, or polyamide adhesive, is applied around the photosensitive area 344 of the image sensor chip 34. The adhesive glue 3262 surrounds all of the bonding wires 36 and covers the first portions 3220, and the inner surface of the carrier 32. The adhesive glue 3262 also fixes the cover 38 and defines a small sealing space 37 configured to seal the photosensitive area 344 therein. The bonding wires 36 and the adhesive glue 3262 are received in the carrier 32. It can be seen that the photosensitive area 344 of the image sensor chip 34 is sufficiently protected from outside pollution due to the small volume of the sealing space 37. The bonding wires 36 are protected by the adhesive glue 3262, and the conductive pieces 322 are protected by the base 324.

Figure 2:
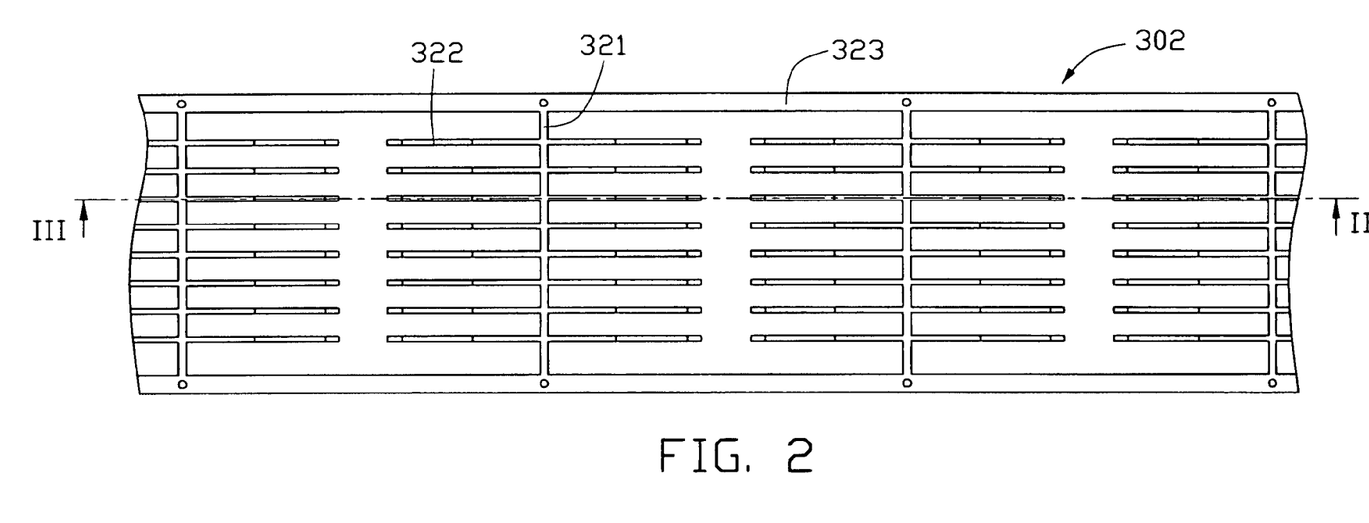
FIG. 2 is a schematic, top-down plan view of the leadframe of FIG. 1.
Figure 3:
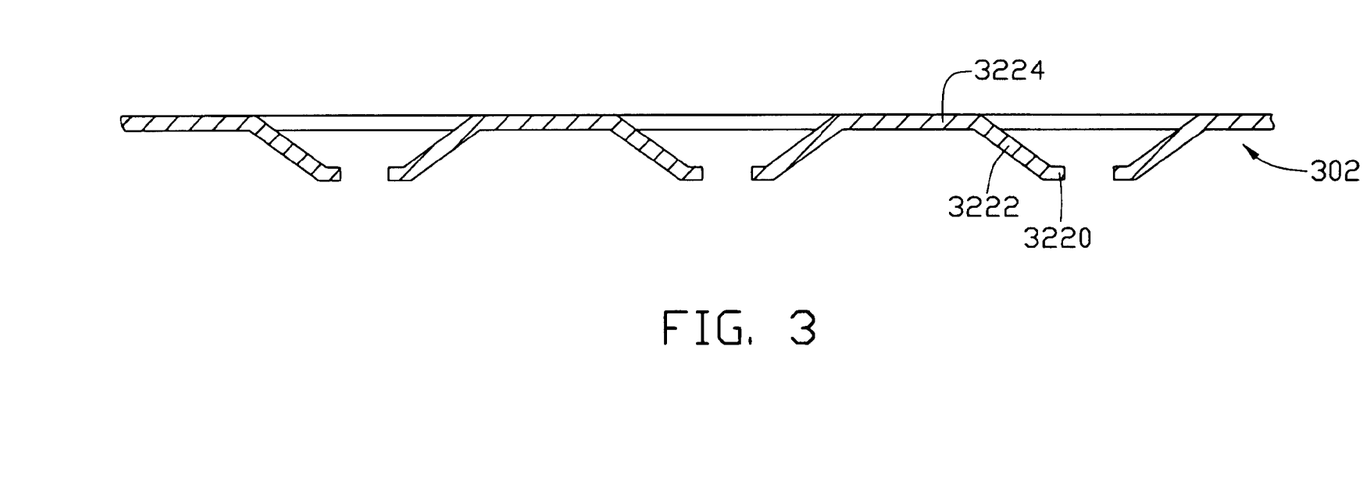
FIG. 3 is a cross-sectional view of the leadframe in FIG. 2 along a line III-III.

A method of fabricating the image sensor chip package 30 is disclosed by way of example. In one embodiment, a plurality of image sensor packages 30 are fabricated simultaneously to minimize the cost associated with each individual image sensor package 30. Referring to FIGS. 2 and 3, firstly, a conductor element 302 is provided. The conductor element 320 is formed on a metal plate by etching. The conductor 321 includes a support beam 321, many groups of conductive pieces 322 and a number of separate beams 323. The conductive pieces 322 are punched so that each of the conductive pieces 322 forms a first terminal portion 3220, a second connecting portion 3222 and a third terminal portion 3224, where the second connecting portion 3222 interconnects the first and third terminal portions 3220, 3224. The first and third portions 3220, 3224 are spaced apart and aligned in parallel to each other. The second portion 3222 is slanted relative to the first and third portions 3220, 3224. Correspondingly, the conductive pieces 322 are divided into two groups. The two groups are symmetrically arranged and the conductive pieces in the same group are parallel to and spaced from each other, thereby forming a plurality of leadframes 320 connected to each other.

Figure 4:
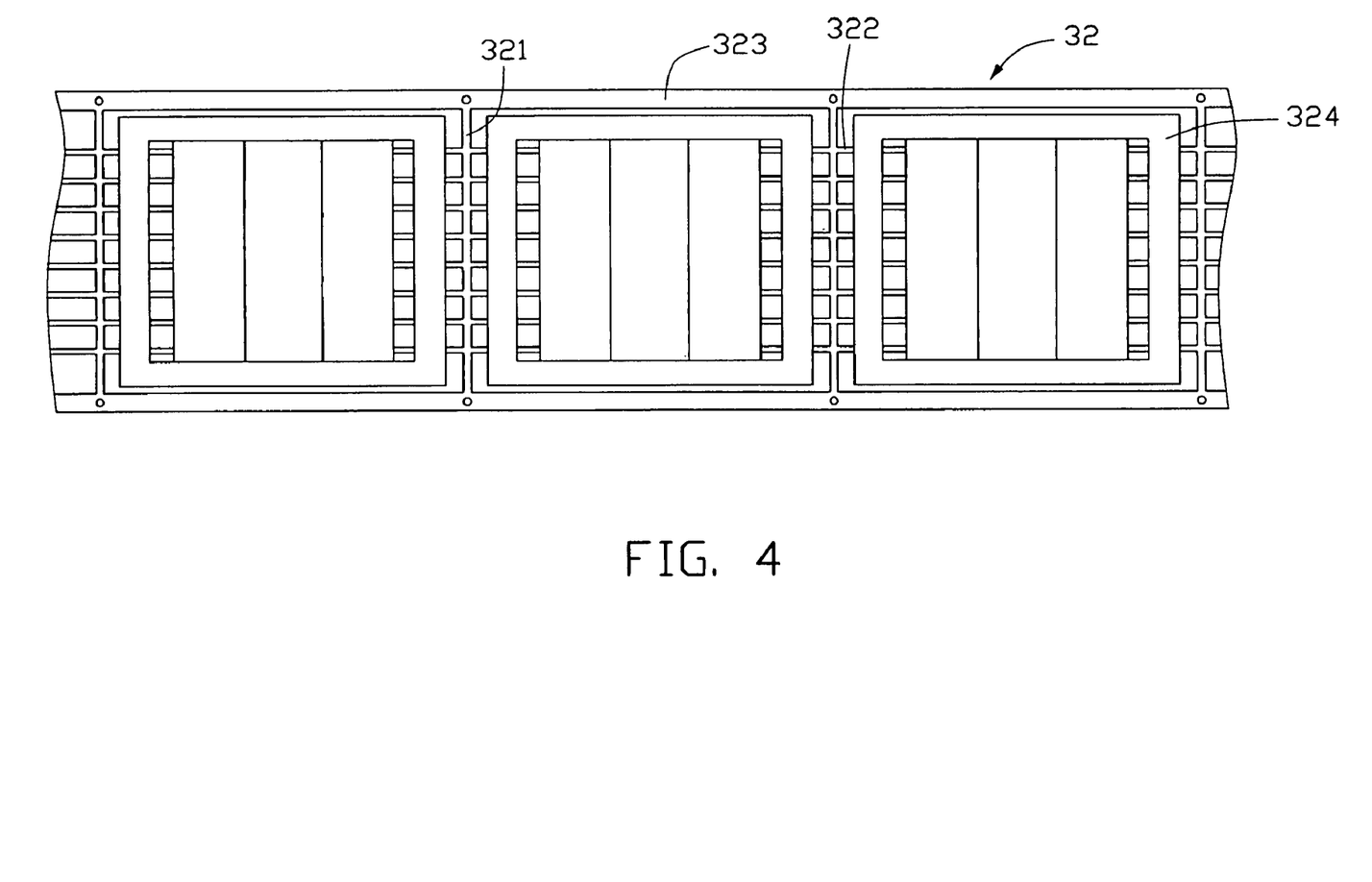
FIG. 4 is a schematic, top view of the carrier formed by insert-molding shown in FIG. 4.

Secondly, the molten plastic is injected into the conductor element 302 by insert-molding. The plastic is solidified to form the plastic base 324. The plastic base 324 partially encloses the upper and lower surfaces of each of the leadframes 320. One end of each of the first portions 3220 is exposed, thus forming a plurality of upper pads 326. A distal end of each of the third portions 3224 is exposed, thus forming a number of lower pads 328. The plastic base 324 and each leadframe 130 cooperatively form a carriers connected each other. Each carrier 32 defines a trapezoidal cavity.

Figure 5:
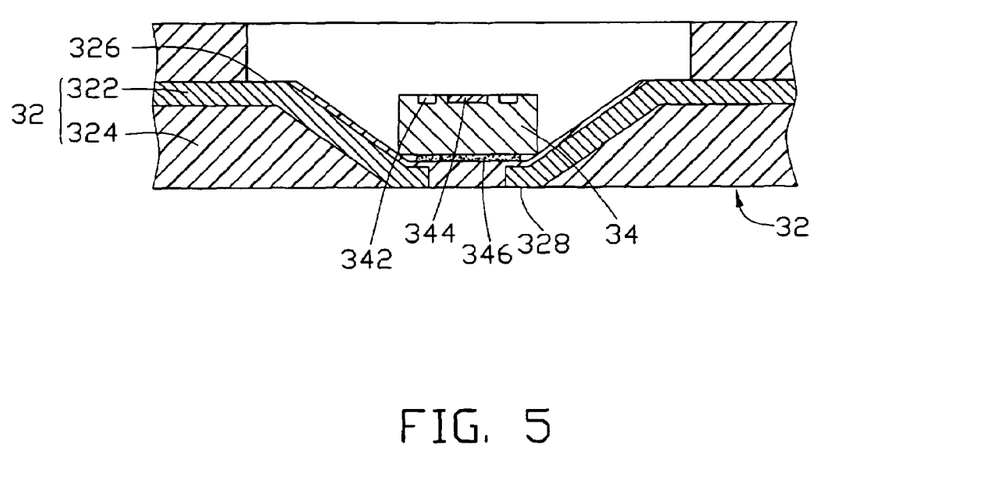
FIG. 5 is a cross-sectional view after the image sensor is put into the carrier.

Thirdly, referring to FIG. 5, each image sensor chip 34 is received in a corresponding trapezoidal cavity, and is adhered to the bottom of the carrier 32 via an adhesive glue 346. Alternatively, the adhesive glue 346 can be replaced by any other appropriate fixing means such as, for example, metallurgical means.

Figure 6:
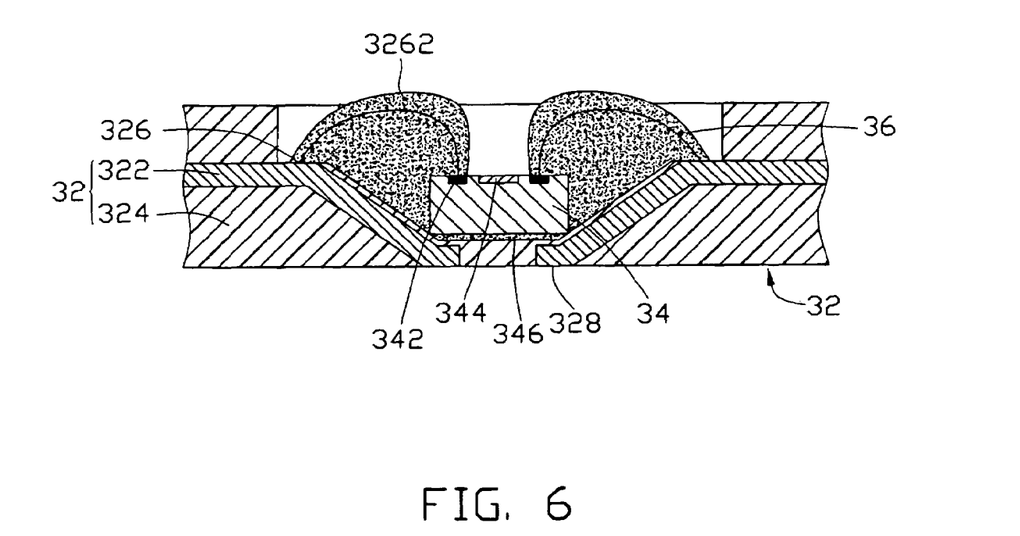
FIG. 6 is a cross-sectional view showing the adhesive glue surrounding all of the bonding wires.

Fourthly, referring to FIG. 6, one end of each wire 36 is connected/joined with a respective chip pad 342 of the image sensor chip 34, and the other end of the wire 36 is connected/joined with a respective upper pad 326 formed by the first portions 3220 of the leadframe 320.

Figure 7:
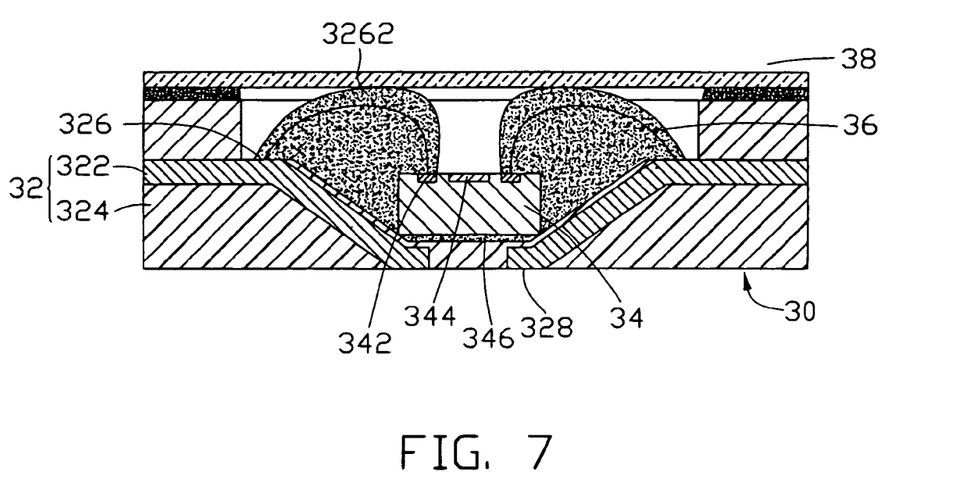
FIG. 7 is a cross-sectional view showing the adhesive glue fixing the cover and defining a small sealing space to seal the photosensitive area.
Figure 8:
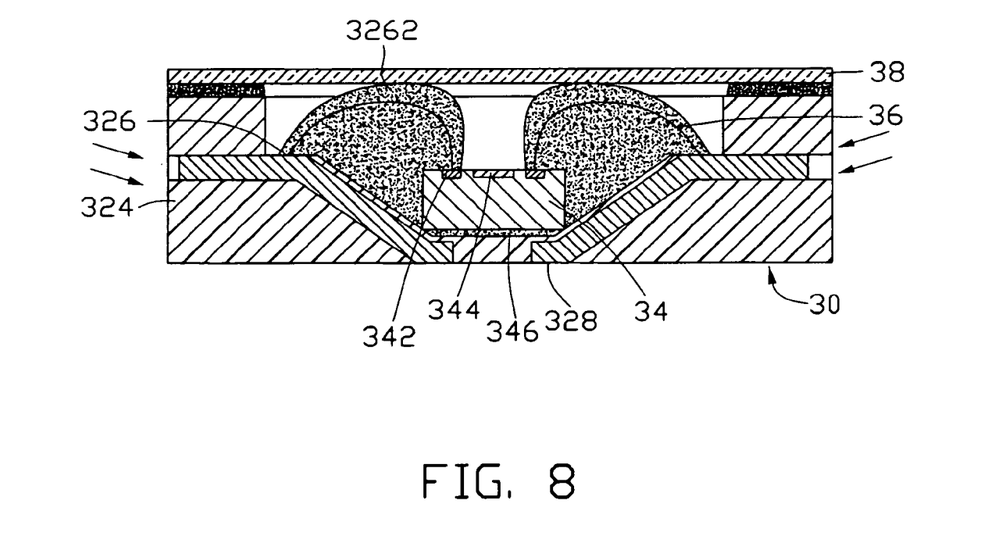
FIG. 8 is a cross-sectional view showing irradiation of the rim of the image sensor package.

Fifthly, referring to FIGS. 7 and 8, each cover 38 is laid over the image sensor chip 34 which receives light transmitted through the cover 38. The cover 38 is adhered on the base 324 by glue (not labeled) and therefore seals the image sensor chip 34 in the cavity of the base 324. The adhesive glue 3262 surrounds all of the bonding wires 36 and covers the first portions 3220, and the inner surface of the carrier 32. The adhesive glue 3262 also fixes the cover 38 and defines a small sealing space 37 configured to seal the photosensitive area 344 therein. The bonding wires 36 and the adhesive glue 3262 are received in the carrier 32. It can be seen that the photosensitive area 344 of the image sensor chip 34 is protected from outside pollution due to the small volume of the sealing space 37. The bonding wires 36 are protected by the adhesive glue 3262, and the leadframe 320 is protected by the base 324.

After that, the conductor element 302 with the plastic base are cut along the rim of each carrier 30 so as to separate a plurality of carriers 30. At that time, distal ends of each of the conductive pieces 322 are exposed outside. Usually, the conductive pieces 322 are shortened owing to shrinkage after the carriers are cut. A kind of heat fusing technology such as ultrasonic fusing, laser fusing or heat fusing may be used to irradiate the rim of the carrier. Accordingly, the plastic base 324 are melted so as to enclose the conductive pieces 322. The manufacture process of the image sensor package 30 is thus completed. By forming a plurality of image sensor packages 30 simultaneously, several advantages are realized. One advantage is that it is less labor intensive to handle and process a plurality of image sensor packages simultaneously rather than to handle and process each image sensor package on an individual base. By reducing labor, the cost associated with each package is minimized.

In an alternative embodiment, the arrangement of the conductive pieces of the leadframe 320 can be changed so long as the conductive pieces 322 are spaced from each other. The second portion 3222 can be perpendicular to the first and third portions 3220, 3224 rather than being slanted. The base 324 can be of another shape such as cylinder-shaped, or column-shaped with a pentagonal or hexagonal cross-section. Understandably, the image sensor package may also be produced in single units.

In the above embodiments, the adhesive glue 3262 may only be disposed around the photosensitive area 344 so as to define a sealing space for protecting the photosensitive area 344. One main advantage of the digital camera module with this image sensor chip package is its reliability and high image quality.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. An image sensor chip package method, comprising the steps of:
   providing a carrier comprising a base and a leadframe, the base having a cavity therein, the leadframe comprising a plurality of conductive pieces, the conductive pieces of the leadframe being embedded in the base and spaced from each other;
   mounting an image sensor chip in the cavity, the image sensor having a photosensitive area;

providing a plurality of wires, each electrically connecting the image sensor chip with a corresponding one of the conductive pieces of the carrier;

applying an adhesive means around the image sensor chip and at least partially covering all the wires; and mounting a transparent cover to the carrier, the adhesive means adhering to the cover in a manner so as to define a sealing space for enclosing the photosensitive area of the image sensor chip therein, and the base and the cover allowing one end of the conductive pieces to be exposed out therefrom.

2. The method as claimed in claim 1, wherein the leadframe is manufactured by punching or etching on a metal sheet, the base being made of plastic materials.

3. The method as claimed in claim 1, wherein each of the conductive pieces of the leadframe comprises a first portion, a second portion and a third portion, the first and second portions are parallel to and spaced from each other, the second portion is slanted relative to the first and third portions.

4. The method as claimed in claim 1, wherein the carrier is formed so as to allow it to enclose the leadframe in the base, and the cavity is trapezoidal in shape.

5. The method as claimed in claim 1, wherein the cover is adhered to the carrier by adhesive.

6. A method of fabricating image sensor packages, comprising the steps of:

providing a conductor element comprising a plurality of conductive pieces;

injecting plastics to partially enclose the conductor element to form a plurality of carriers connected to each other, each carrier having a plurality of pads formed by the conductive pieces outside the carrier;

mounting image sensor chips in the carriers, each image sensor chip having an active area;

providing a plurality of wires each electrically connecting the image sensor chip with the conductive pieces;

adhering a transparent cover to each carrier via a first adhesive means, thereby defining a sealing space for sealing the active area of the image sensor chip therein; and separating the carriers to form single carrier units.

7. The method as claimed in claim 6, wherein a second adhesive means is applied around the active area of the image sensor chip, the cover being adhered with the second adhesive means so as to define a sealing space therebetween, thereby sealing the active area of the image sensor chip therein.

8. The method as claimed in claim 6, wherein the base of the carrier has a cavity therein, the conductive pieces embedded in the base and spaced from each other.

9. The method as claimed in claim 8, wherein the conductor element is manufactured by punching or etching on a metal sheet, the base is made of plastic materials.

10. The method as claimed in claim 8, wherein the carrier is manufactured by insert-molding.

11. The method as claimed in claim 8, wherein each of the conductive pieces of the conductive means comprises a first portion, a second portion and a third portion, the first and third portions are parallel to and spaced from each other, and the second portion is slanted relative to the first and third portions.

12. The method as claimed in claim 7, wherein the base of the carrier has a cavity for receiving the chip, the conductive means comprises a plurality of conductive pieces embedded in the base and spaced from each other.

13. The method as claimed in claim 12, wherein the first conductive means forms a plurality of pads outside the base, the chip has a plurality of chip pads around the active area, the second conductive means has a plurality of wires each connecting one pad of first conductive means with one corresponding chip pad of the chip.

14. The method as claimed in claim 6, further comprising a step of heat fusing the rim of the carrier so as to enclose the conductive pieces in the plastic.

* * * * *

UNITED STATES PATENT AND TRADEMARK OFFICE
CERTIFICATE OF CORRECTION

PATENT NO. : 7,592,197 B2  Page 1 of 1
APPLICATION NO. : 11/453456
DATED : September 22, 2009
INVENTOR(S) : Webster et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 621 days.

Signed and Sealed this

Twenty-first Day of September, 2010

David J. Kappos
*Director of the United States Patent and Trademark Office*